(12) United States Patent
Cheah

(10) Patent No.: US 6,396,138 B1
(45) Date of Patent: May 28, 2002

(54) CHIP ARRAY WITH TWO-SIDED COOLING

(75) Inventor: Chuan Cheah, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/504,679

(22) Filed: Feb. 15, 2000

(51) Int. Cl.[7] ............................................. H01L 23/48
(52) U.S. Cl. ...................... 257/692; 275/734; 275/735
(58) Field of Search ................................ 257/675, 738, 257/692, 707, 734, 735; 438/411, 461, 611, 613

(56) References Cited

U.S. PATENT DOCUMENTS

| | | | | |
|---|---|---|---|---|
| 5,311,059 A | * | 5/1994 | Banerji | 257/778 |
| 5,578,841 A | * | 11/1996 | Vasquez | 257/220 |
| 5,789,809 A | * | 8/1998 | Joshi | 257/704 |
| 5,959,356 A | * | 9/1999 | Oh | 257/738 |
| 5,977,626 A | * | 11/1999 | Wang | 257/707 |
| 6,066,512 A | * | 5/2000 | Hashimoto | 438/112 |
| 6,075,279 A | * | 6/2000 | Andoh | 257/620 |
| 6,208,019 B1 | * | 3/2001 | Tane | 257/679 |

FOREIGN PATENT DOCUMENTS

JP        356094760 A  *  7/1981

* cited by examiner

Primary Examiner—Olik Chaudhuri
Assistant Examiner—Nathan W. Ha
(74) Attorney, Agent, or Firm—Ostrolenk, Faber, Gerb & Soffen, LLP

(57) ABSTRACT

A semiconductor device including a substrate and a die supported thereon. The substrate has at least one electrical connection region on a first portion of a surface of the substrate. The die has a bottom surface portion supported by a second portion of the surface of the substrate. The die also includes a top surface portion comprising a metal layer and a number of semiconductor elements below the metal layer. The top and bottom surface portions of the die are separated by a die body portion which lies above the surface of the substrate. A conforming metal layer extends from at least a portion of the metal layer of the top surface of the die and electrically interfaces with the at least one electrical connection region on the first portion of the surface of the substrate.

4 Claims, 11 Drawing Sheets

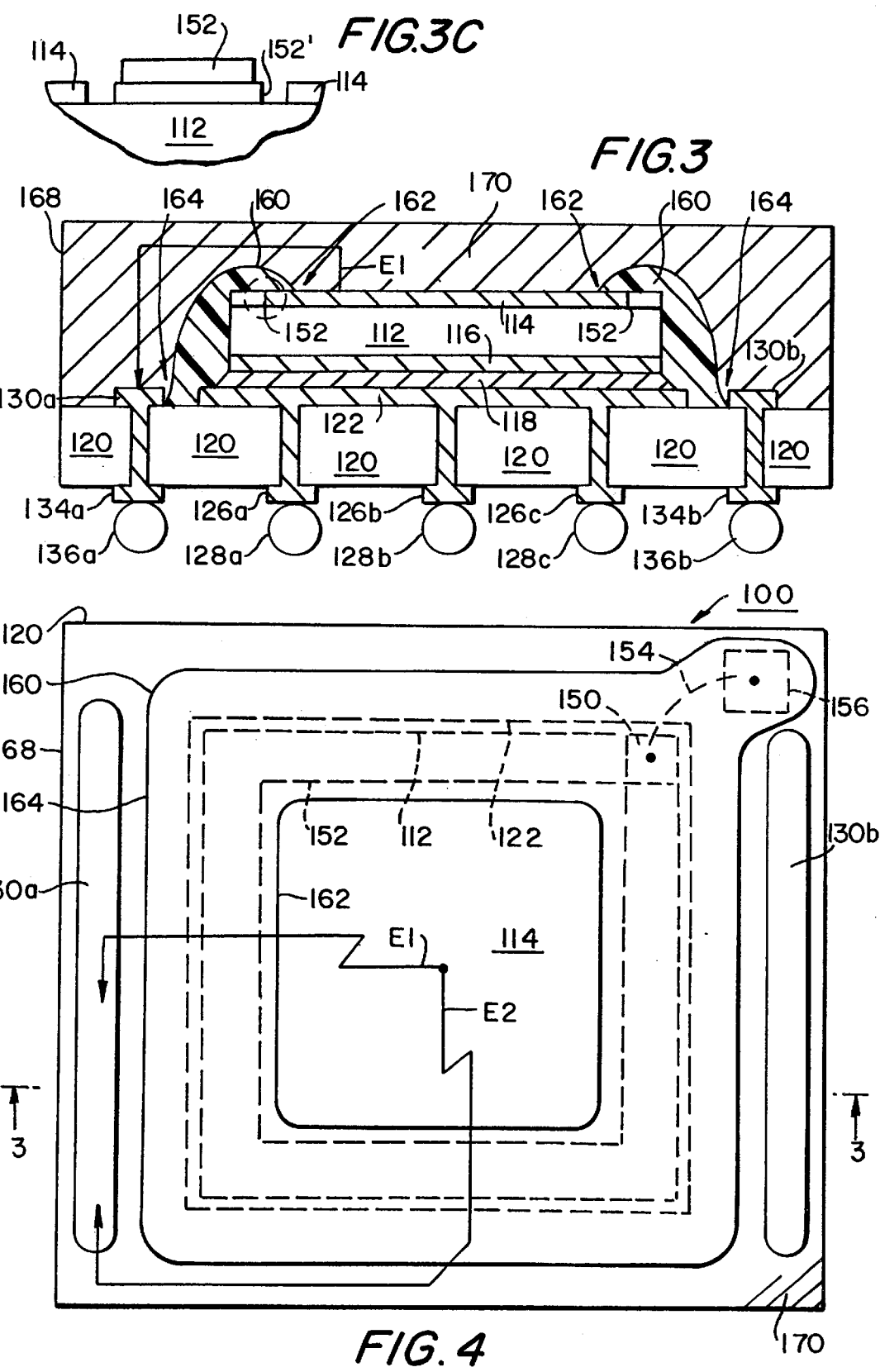

CHIP ARRAY WITH TWO-SIDED COOLING

BACKGROUND OF THE INVENTION

1. Field of the Invention

The invention relates to semiconductor chip packages and, in particular, to improving the heat dissipation of such chip packages.

2. Related Art

With reference to FIG. 1, a semiconductor package 10 according to the prior art is shown. The semiconductor package 10 includes a bottom plate portion 13 (such as lead frame segment) and terminals 12a, 12b. A semiconductor die 16 is disposed on top of the bottom plate portion 13 and fastened thereto, typically using a conductive epoxy material 14. The semiconductor die 16 includes a metalized region 18 defining a connection area for a top surface of the semiconductor die 16. An array of semiconductor diffusions (not shown) lie below metalized region in die 16. Portions of the terminals 12a, 12b, bottom plate portion 13 (which may be parts of a common lead frame, and semiconductor die 16 are encapsulated in a housing 22, typically formed from a moldable material in a transfer molded operation. In order to obtain an electrical connection between the metalized region 18 and the terminal(s) 12b, one or more conductive wires 20 are ultrasonically bonded at one end 21a to the metalized region 18 and at a distal end 21b to the terminal 12b.

FIG. 2 shows another semiconductor package 100 of the prior art. In order to electrically connect the metalized region 18 with the terminal 12b, one or more wires 24 are stitch bonded at locations 23, thereby providing additional paths for current to flow from the semiconductor die 16 to the terminal 12b. This reduces the resistance of the current path from the semiconductor die 16 to the terminal 12b.

The devices described above have a number of disadvantages. The devices can exhibit higher resistance and inductance in the current paths through the package than is acceptable. High resistance and inductance can significantly and deleteriously impact the high frequency performance of certain semiconductor devices, such as MOSFETs.

Referring to FIG. 1, for example, it is seen that much of the upper metalized surface 18 is relatively remote from the bond 21a with wire 20 (such as the portion at the distance "D"). Thus, the current path for the source connections (in the case of a MOSFET) of the semiconductor junctions in the central region of the die 12 must pass a significant distance through the thin metalized contact layer 18. Although additional wire connections could be provided to the other regions, including, for example, by the stitch bonding of FIG. 2, construction of such a device is more complex and costly than for the device of FIG. 1.

In addition, the wire(s) 20 themselves introduce significant resistance and inductance in the current path between the terminal 12b and the metal contact layer 18. While the number of wire bonds could be increased, construction of such a device is again complex and costly.

The heat generated by the devices of FIGS. 1 and 2 can also create problems in performance. As noted above, an array of semiconductor elements, comprising p-n junction regions, lies below the surface of metalized region 18. There can be thousands of semiconductor elements on a typical cellular type MOSgated device die. Thus, the heat generated by electrical conduction through the die is significant and is concentrated at the upper surface, adjacent the thin metalized layer 18. The thin metalized region 18 cannot provide significant heat dissipation; nor can the thicker bottom plate 13, since it is removed to the opposite side of the silicon die 12. Such heat generation within the device increases resistances and inductances, again degrading performance.

SUMMARY OF THE INVENTION

The present invention provides a semiconductor package having decreased electrical resistance to the upper die junction patterns of the semiconductor elements residing therein, as well as improved heat dissipation of the semiconductor elements. By "upper die junction patterns", it is meant the electrical connections made between the top metal surface layer of the package and the semiconductor elements residing therein. (These will also be referred to as the "upper die connections".) For example, for a MOSFET, it may refer to the source connections of the semiconductor elements; for an IGBT or other transistor, it may refer to the emitter; for a diode it may be the anode, etc.

In accordance with the present invention, a conforming metal layer extends between the metalized region exposed on the top surface of the die (connected with the upper die connections of the semiconductor elements) and lands or other conductive areas on the upper surface of the substrate used for providing an external electrical source connection. The conforming metal layer provides a substantial low resistance electrical pathway between all portions of the metalized region and the lands, thus reducing the electrical resistance to the semiconductor elements. The conforming metal layer is relatively thick and is in direct contact with much of the metalized region, thus also providing substantial heat dissipation of the semiconductor elements.

Thus, in general, the present invention provides a semiconductor device including a substrate and a die supported thereon. The substrate has at least one electrical connection region on a first portion of a surface of the substrate. The die has a bottom surface portion supported by a second portion of the surface of the substrate. The die also includes a top surface portion comprising a metal layer and a number of semiconductor elements below the metal layer. The top and bottom surface portions of the die are separated by a die body portion which lies above the surface of the substrate. A conforming metal layer extends from at least a portion of the metal layer of the top surface of the die and electrically interfaces with the at least one electrical connection region on the first portion of the surface of the substrate.

The invention also includes a semiconductor device comprising a substrate having an upper surface with a central region and a surrounding perimeter region. The surrounding perimeter region has at least one electrical land residing thereon. A die having a bottom surface portion is supported by at least a portion of the central region of the substrate and includes a top surface portion comprising a metal layer and a number of junctions of semiconductor elements below the metal layer. The top surface portion and the bottom surface portion of the die are separated by a die body portion lying above the surface of the substrate. A conforming metal layer extends from at least a portion of the metal layer of the top surface of the die and electrically interfaces with the at least one electrical land on the perimeter region of the substrate.

The invention includes a method of manufacturing conforming metal layers for semiconductor packages or die arrayed on the surface of a wafer. First, an insulating layer is applied to any exposed areas on the upper surface of each package that are electrically connected to the semiconductor elements other than the upper die connections of the semiconductor elements. (Thus, for example, any exposed connections with the drain or gates of MOSFET semiconductor elements on the upper surface would be so insulated.) Any electrical connections on the upper surface of the substrate (such as lands) that are to electrically interface with the upper metalized region remain significantly exposed.

A dam is fabricated surrounding the perimeter of the wafer, thus enveloping all die thereon. The dam extends higher than the highest point of each die, including any insulation. A flowable, curable metal is poured into the top portion of the wafer defined by the conductive dam. The flowable metal is sometimes termed a "lead free replacement" metal. Other materials, for example, a conductive epoxy could also be used as the "flowable metal". The flowable metal fills in all of the contours exposed on the upper surfaces of each the wafer, including each die thereon. (This is why the resulting metal layer, when cured, is referred to throughout as a "conforming" metal layer.) Since the height of the dam is higher than metalized region of the top surfaces of each die, the flowable metal is poured until the top surfaces are all submerged. The flowable metal can spread over the wafer surface by a squeeze action.

The flowable metal thus extends between the upper metalized region of each die and the exposed portions of the electrical connections on the upper surface of the substrate that provide electrical connections therefor. When the flowable metal layer cures, the wafer is then cleaved or diced as by sawing. The resulting individual semiconductor packages each include a conforming metal layer providing an electrical connection between the metalized region on the upper surface of the die and the lands or other conductive areas on the upper surface of the wafer providing an electrical connection.

Thus, the present invention includes a method of manufacturing a semiconductor device comprising at least one die and a substrate. The substrate has at least one electrical connection region on a top surface of the substrate. The at least one die has a bottom surface supported by the top surface of the substrate separate from the at least one electrical connection region. The at least one die further comprises a top surface having a metal layer and a number of semiconductor elements below the metal layer. The method of manufacture comprises the steps of:

a) insulating portions that are exposed on and above the top surface of the substrate that are electrically connected to portions of the semiconductor elements other than upper die connections, b) enveloping the region above the top surface of the substrate to at least encompass the at least one die and the at least one electrical connection region of the substrate, the dam extending higher than the top surface of the at least one die, c) pouring a flowable, curable conductive material into the region defined by the dam above the top surface of the substrate, the conductive material covering the top surface of the at least one die, and d) curing the flowable conductive material, whereby an electrical connection is made between the at least one electrical connection region on the surface of the substrate and metal layer of the top surface of the at least one die.

BRIEF DESCRIPTION OF THE DRAWINGS

FIG. 3 is a cross-sectional view of a semiconductor package according to the present invention, taken across lines 3—3 of FIG. 4;

FIG. 3C is a partial cross-sectional view of a region of the device of FIG. 3;

FIG. 4 is a top view of the semiconductor package introduced in FIG. 3;

DETAILED DESCRIPTION

Figure 1:
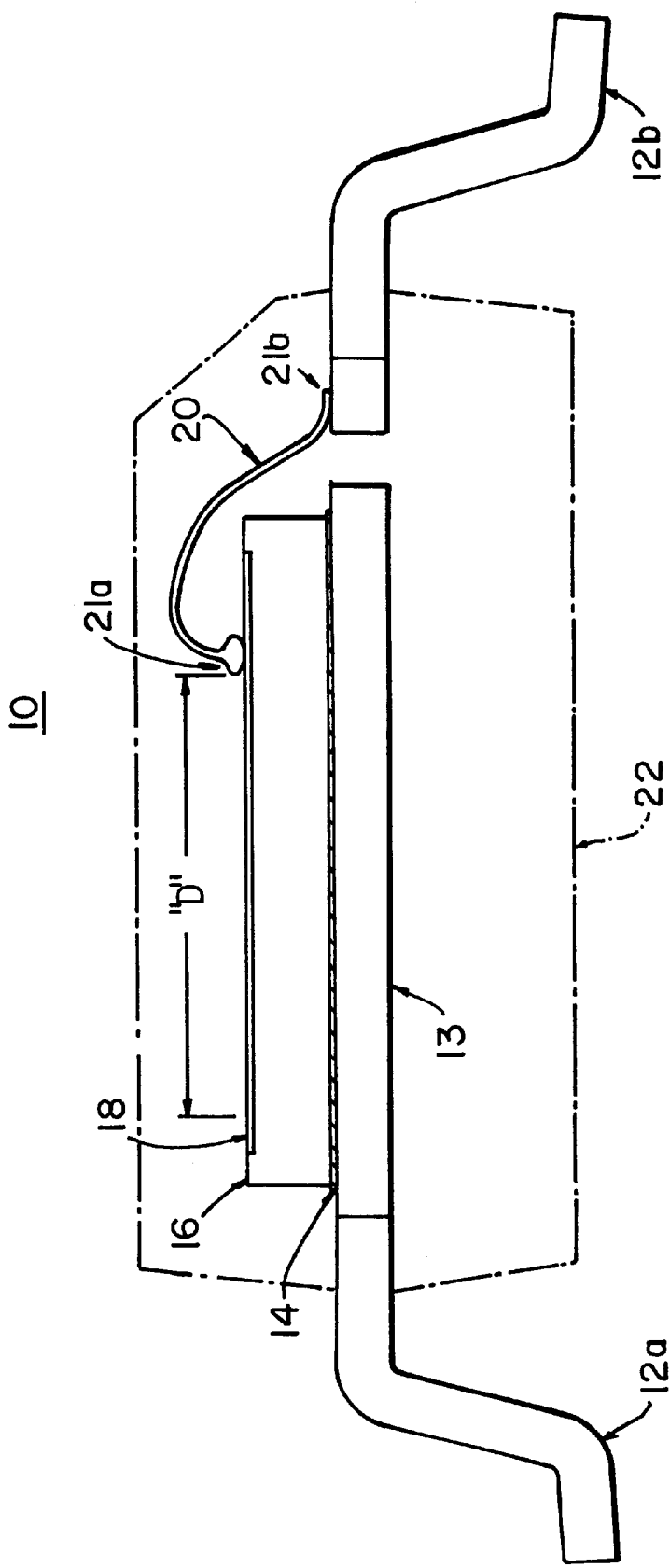
FIG. 1 is a cross-sectional view of a known semiconductor package.
Figure 2:
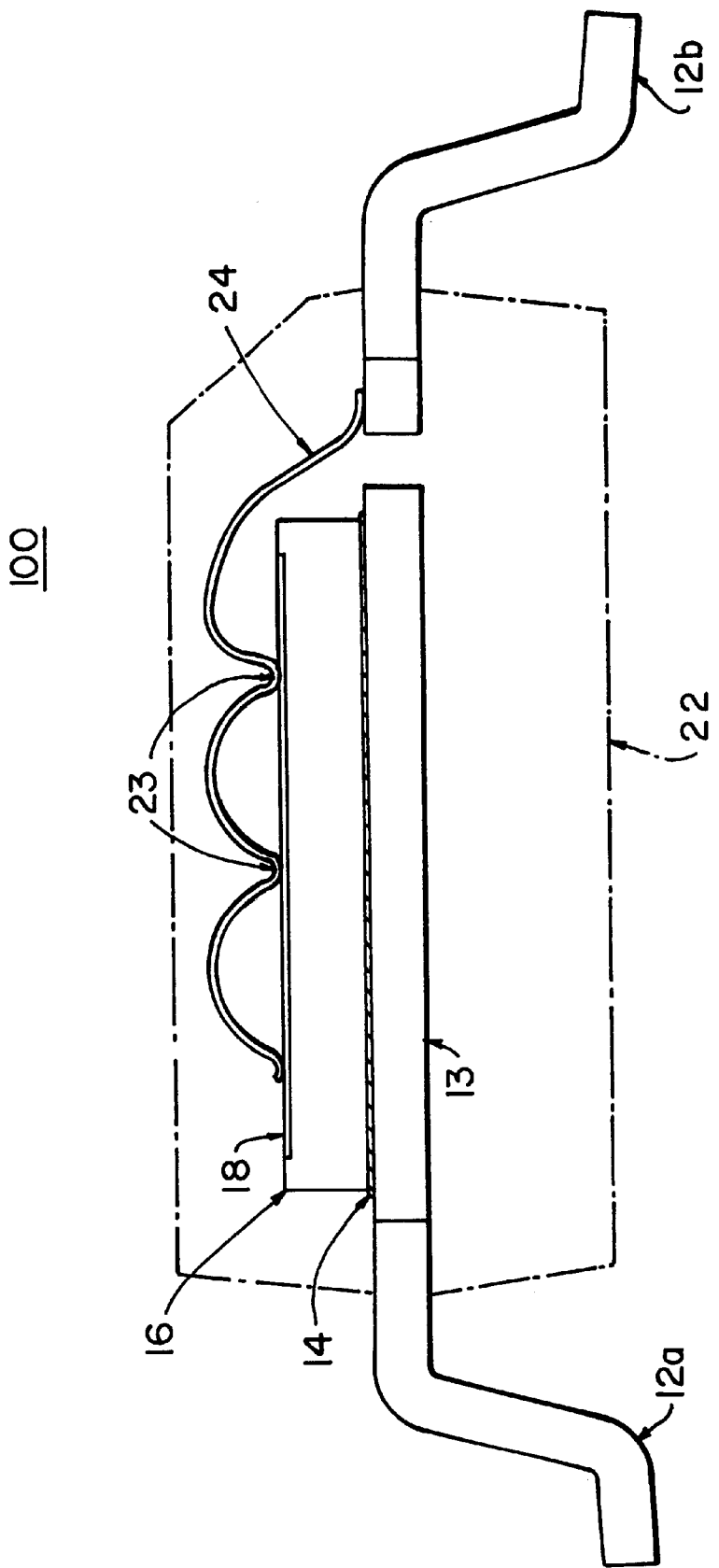
FIG. 2 is a cross-sectional view of another known semiconductor package.

FIG. 3 illustrates a singulated semiconductor package 100 according to the present invention. The upper portion of the package 100 includes semiconductor die 112, having an upper metalized region 114 and conductive bottom plate 116. The lower portion of the package 100 includes substrate 120, which supports die 112, among other things.

Die 112 can be a vertical conduction power MOSFET in which region 114 is a source electrode and electrode 116 is a drain electrode, and the discussion below will focus on this embodiment. However, die 112 can be other types of semiconductors or other electrical components, for example, a bipolar transistor, SCR, diode, or other device having an upper electrode such as source 114 which is thermally separated from heat sink/substrate 120.

Metalized region 114 provides the source connection area for the top surface of the semiconductor die (and will thus be referred to in the alternative as the "source connection area" or the "source connection"). An array of MOSFET semiconductor elements or diffusions, such as a DMOS structure (not shown) lie below metalized region 114 in die 112. The metalized region 114 is suitably connected to adjacent surface regions of the semiconductor elements. Bottom conductive layer 116 provides the device drain contact.

The substrate 120 may be a conventional thin insulation ceramic used to mount and to permit the electrical connection of the die 112 to a circuit board, for example. Bottom plate 116 of die 112 is electrically connected to upper conductive plate 122 (which may be a lead frame) on the surface of substrate 120 by a layer of conductive epoxy 118 or solder or other equivalent material. Plate 122 is electrically connected to an array of vias 124a, 124b, 124c extending through the central portion of substrate and ending at an array of conductive lands 126a, 126b, 126c. Solder balls 128a, 128b, 128c on lands 126a, 126b, 126c can be used for mounting and electrically connecting the drain contact to a circuit board.

Die 112 does not overlay the peripheral edges of substrate 120. A pair of upper lands 130a, 130b, vias 132a, 132b and lower lands 134a, 134b are supported by the peripheral edges of the substrate 120. Solder balls 136a, 136b on lands 134a, 134b can be used for mounting and electrically connecting the source contact to a circuit board.

Figure 3A:
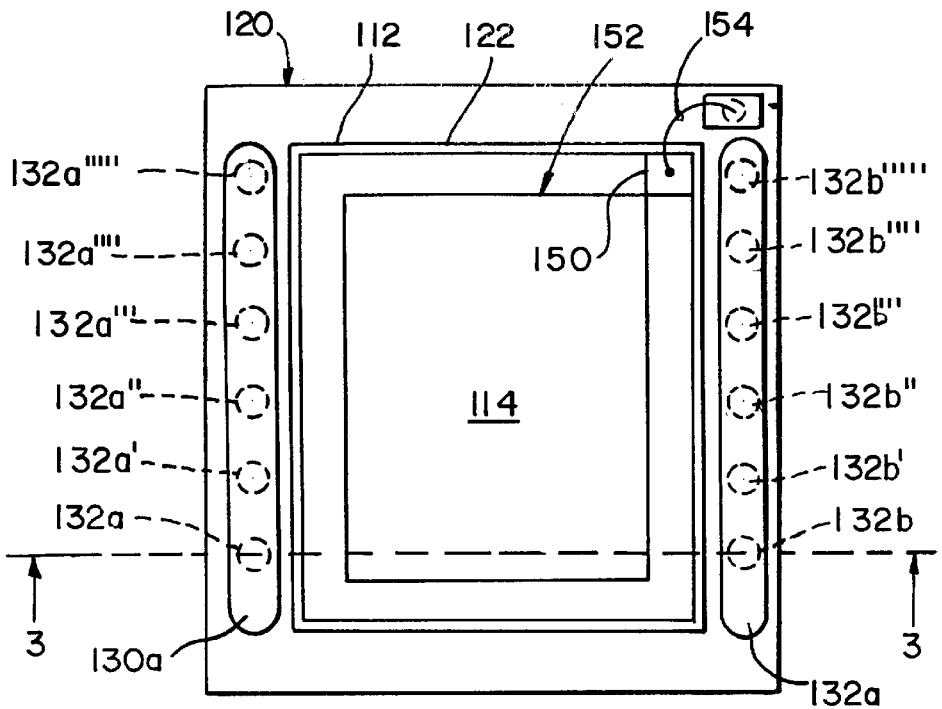
FIG. 3A is a top view of the semiconductor package of FIG. 3 with some of the upper structure omitted.
Figure 3B:
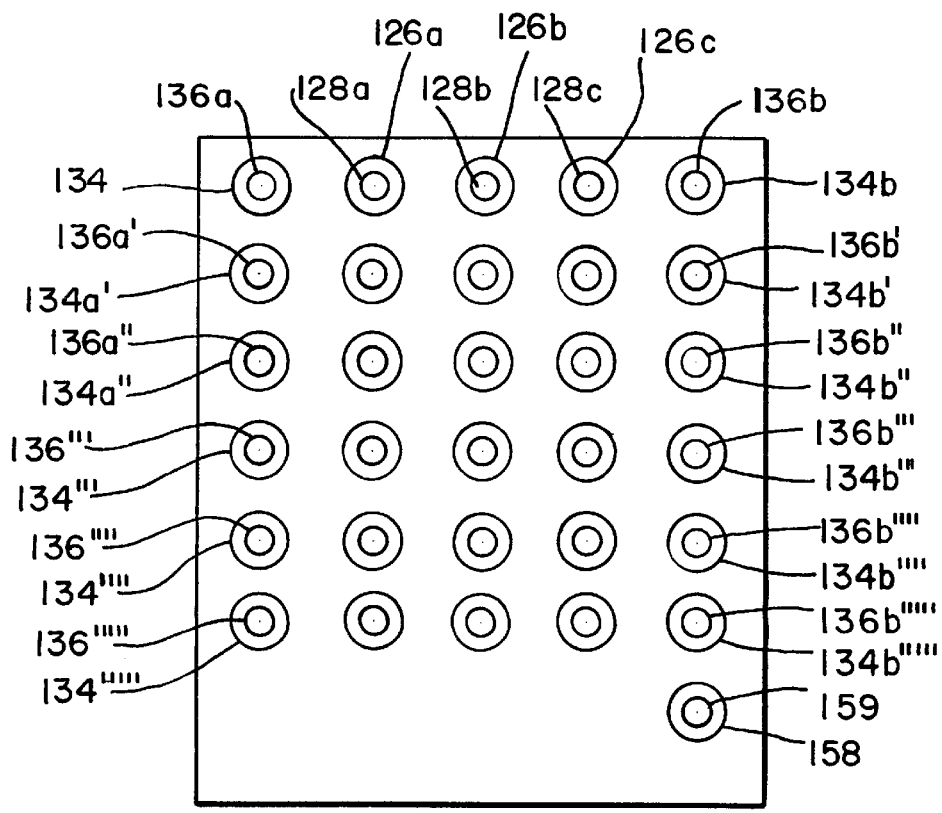
FIG. 3B is a bottom view of the semiconductor package of FIG. 3.

FIGS. 3A and 3B, which show top and bottom views of FIG. 3, are now referred to briefly. As seen, the cross-sectional view of FIG. 3 is taken across lines 3—3 of FIG. 3A. Also, for ease of description, some of the upper structure shown in FIG. 3 has been omitted in FIG. 3A, in particular, the structure having reference numbers 160 and 170. This structure will be described in more detail in conjunction with FIG. 4.

FIG. 3A shows that lands 130a and 130b on the peripheral edge of substrate 120 extend along the surface of the substrate 120 adjacent edges of the die 112. The vias in the substrate corresponding to the source connections are actually two series of vias 132a-132a and 132b-132b (shown in dashed lines in FIG. 3A) connected to lands 130a, 130b, respectively, and extending through substrate 120.

FIG. 3A also illustrates a metallic gate pad 150 on a corner surface of the die 112 and electrically connected with gate runner 152. Gate pad 150 is spaced from source electrode 114. Gate fingers 152 traverse the surface of the die within the planar borders of metalized region 114 in the usual manner. Referring back to FIG. 3, gate fingers 152 are exposed but are also separated from metalized region 114 and also electrically isolated from the surface of the die 112 by an insulating layer 152' which may be a portion of the field oxide used during the device fabrication. (see FIG. 3C).

Referring again to FIG. 3A, gate pad 150 is connected by bond wire 154 to land 156 on the surface of the corner of substrate 120. A via (shown in dashed lines) extends through substrate 120 to a land on the opposite side of substrate 120 (shown in FIG. 3B and described below), thus allowing the gates of the semiconductor die to be electrically connected to a circuit board.

FIG. 3B is a bottom view of the device of FIGS. 3 and 3A. Lands 134a, 134b correspond to those providing the source connections shown in cross section in FIG. 3. Lands 134a-134a are electrically connected to vias 132a-132a, respectively, and upper land 130a shown in FIG. 3A. Likewise, lands 134b-134b are electrically connected to vias 132b'-132b, respectively, and upper land 130b shown in FIG. 3A. (Solder balls 136a-136a and 136b-136b are illustrated for each respective land. As described above, these solder balls are used to electrically connect the source to a circuit board and for mounting the package 100 to the circuit board.)

FIG. 3B also shows lands 126a, 126b, 126c corresponding to those shown in cross section in FIG. 3 providing drain connections with the die 120. The rows of lands shown in FIG. 3B below lands 126a, 126b, 126c are also connected by vias to upper conductive plate 122, which is electrically connected to the bottom plate 116 (see FIG. 3 and description above). Thus, these three rows of lands define an array providing electrical connection with the drain of the die. (Again, the lands are each shown to have solder balls, which are used to electrically connect the drain to a circuit board and for mounting the package 100 to the circuit board.)

Finally, land 158 is electrically connected by the via (described above) to land 156 shown in FIG. 3A on the top surface of the substrate 120. Thus, land 158 is electrically connected to gate pad 150 and gate runner 152 (see FIG. 3A). Thus, an electrical connection with the gates of the semiconductor elements is provided when land 158 is mounted to a circuit board (via solder ball 159).

Referring back now to FIG. 3, an insulating layer 160 extends between the exposed upper surface of substrate 120, up the side edge of semiconductor die 112 and over a side portion of metalized layer 114 on the top surface of die 112. The lower border (i.e., on the substrate 120) of insulating layer 160 is denoted with reference numeral 164, while the upper border (i.e., on the metalized layer 114) is denoted with the reference numeral 162. Insulating layer 160 covers gate runners 152.

FIG. 4 is a top view of the package 100. As noted above, FIG. 4 is the same view as in FIG. 3A, with certain of the upper structure omitted in FIG. 3A shown in place in FIG. 4. (Thus, FIG. 3 is also a cross-sectional view of FIG. 4 along lines 3—3.) As seen from FIG. 3, the actual top view of the package 100 is limited to the surface of conforming layer 170, described below. However, in order to show the spatial relationship of the other upper layers to other elements of the package 100, the top layer 170 is omitted from FIG. 4 and a number of the elements lying below the layers are shown in phantom in FIG. 4. (The phantom features shown in FIG. 4 have been described above with respect to FIG. 3A.)

Referring to FIG. 4, it is seen that insulating layer 160 described above with respect to FIG. 3 extends between the metalized layer 114 of the die 112 to the upper surface of the substrate 120 around the entire die 112. (Insulating layer 160 can be also identified in FIG. 4 between borders 162, 164.) Thus, the gate fingers 152 are covered, as are all sides of the die. Also, gate pad 150 (on the upper surface of die 112) and land 156 (on the upper surface of substrate 120) is covered with insulating layer 160, as is wire 154 connecting gate pad 150 and land 156.

Referring back to FIG. 3, conforming metal layer 170 extends into and above any interstices on the upper surface of package 100. Metal layer 170 is preferably an initially flowable metal that hardens or cures into solid form. How conforming metal layer is fabricated is described further below with respect to FIGS. 5–8. Metal layer 170 provides an electrical path between metalized layer (source connection area) 114 and upper lands 130a, 130b. (Non-source electrical connections, such as gate runner 152, bottom plate 116, conductive epoxy 118 and conductive plate 122 are insulated from metal layer 170 by insulating layer 160.)

Providing the source electrical connection through the metal layer 170 allows the source connection wires to be eliminated. The electrical path through metal layer 170 and conductive dam 206 is expansive compared to conductive wires, thus reducing the source resistance for the package.

As noted, metal layer 170 has been omitted from FIG. 4, in order to show the spatial relationships between insulating layer 160 and the other components of package 100. (Comparison with FIG. 3 shows that if metal layer 170 were shown in FIG. 4, it would cover the entire top surface of the package 100, within boundary 168.) Thus, the electrical pathway between the source electrode 114 and upper lands 130a, 130b extends in all directions from all points on the exposed (non-shaded) surface of the metalized region 114 shown in FIG. 4, through the metal layer 170 (and over insulating layer 160) to the upper lands 130a, 130b. Two such paths, E1 and E2, are shown in FIGS. 3 and 4. The increase in the extent of the electrical pathway between metalized region 114 and upper lands 130a, 130b provided by metal layer 170 significantly reduces the source resistance of the package 100.

FIGS. 3 and 4 of the present invention also show that metalized region and source electrode 114 is covered by thick metal layer 170. Thus, metal layer 170 provides an effective heat sink for the heat generated at the surface of die 112 by the array of semiconductor elements (not shown). The heat sink improves the performance of the device, for example, by reducing the source resistance.

In order to insulate the drain 116 from the source, insulating layer 160 makes contact with the upper surface of the substrate 120, as shown in FIG. 3. The boundary 164 of insulating layer 160, however, may cover a portion of the upper lands 130a, 130b, provided there is sufficient electrical contact between upper lands 130a, 130b and metal layer 170.

The embodiments of the present invention described with respect to FIGS. 3–4 show a single package and, in particular, a MOSFET. As noted above, the invention applies to any semiconductor package that has an upper metalized region connected to upper die connections, such as transistors, diodes, etc. The insulating layer 160 would cover exposed areas of the die that are electrically connected to the semiconductor elements other than the upper die connections. The metal layer 170 would provide an expansive connection between the upper metalized region and external electrical connections, such as lands 130a, 130b.

For example, if the die shown in FIG. 3 were an IGBT, the insulating layer 160 would be applied to insulate the collector electrode at the bottom perimeter of the die and also the gate fingers at the top surface of the die. (Thus, the insulating layer 160 for the IGBT might look similar to the one for the MOSFET shown in FIG. 3.) Metal layer 170 would provide an expansive connection between the upper metalized surface (emitter electrode) and the lands 130a, 130b.

Figure 5:
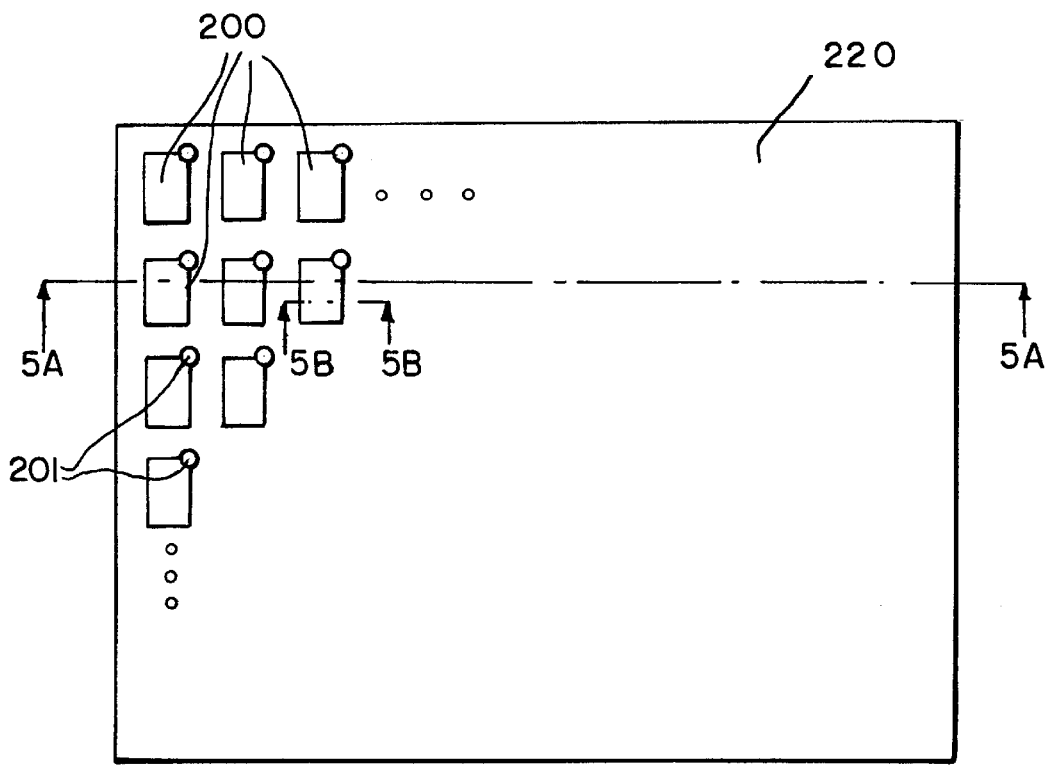
FIG. 5 is a top view of a semiconductor wafer supporting an array of semiconductor die.
Figure 5A:
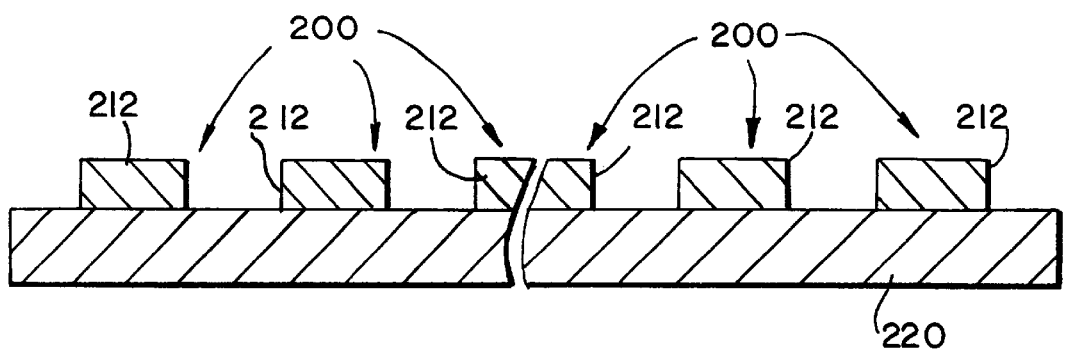
FIG. 5A is a cross-sectional view of the semiconductor wafer and array of die of FIG. 5, taken across lines 5A—5A of FIG. 5.

FIGS. 5–9 show how the individual package of FIGS. 3–4 is constructed. Referring to FIG. 5, a top view of an array of semiconductor package portions 200 are shown supported on a wafer 220. FIG. 5A is a cross-section of the wafer and array of FIG. 5 taken along lines 5A—5A, again showing a row of package portions 200 in cross-section across the wafer 220.

Figure 5B:
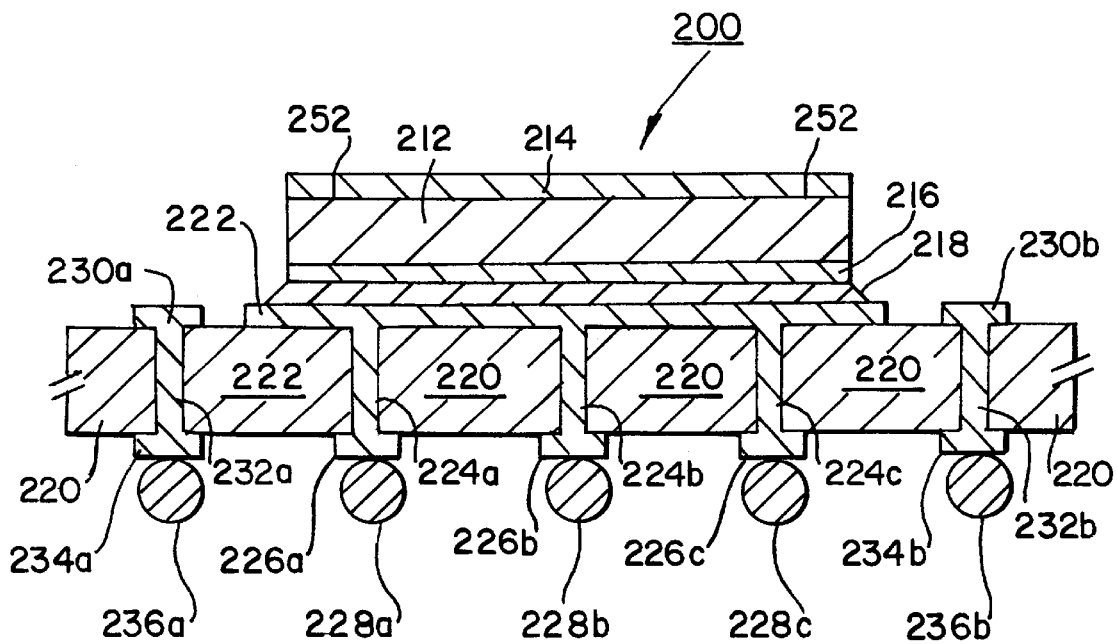
FIG. 5B is a partial cross-sectional view of the semiconductor wafer and one of the die of FIG. 5, taken across lines 5B—5B of FIG. 5.

Each of the package portions 200 shown in FIGS. 5 and 5A have the same detailed structure as the individual package shown in FIGS. 3–4. FIG. 5B shows one such package portion, which is a cross-section of one of the package portions 200 taken across lines 5B—5B of FIG. 5. The reference numerals for the elements of package portion 200 of FIG. 5B have been increased by 100 from the corresponding reference numerals used with respect to FIGS. 3–4 in order to distinguish the package portion of the wafer of FIG. 5B from the individual package shown in FIGS. 3–4.

For clarity, only certain structural detail of each package portion 200 has been included for each package shown in the arrays of FIGS. 5 and 5A. The gate pad of each package is signified by the small bulges 201 shown in FIG. 5.

Figure 6B:
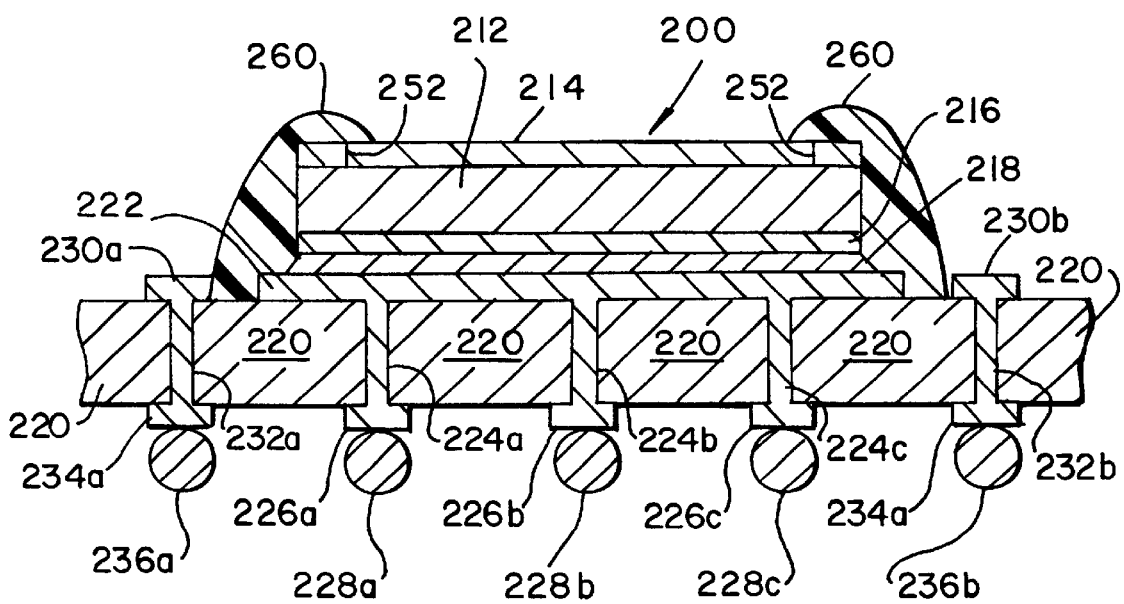
FIGS. 6–6B are the semiconductor wafer and semiconductor die of FIGS. 5–5B, respectively, having insulating layers deposited in accordance with the invention (thus, FIG. 6A is taken across lines 6A—6A of FIG. 6 and FIG. 6B is taken across lines 6B—6B of FIG. 6)
Figure 6:
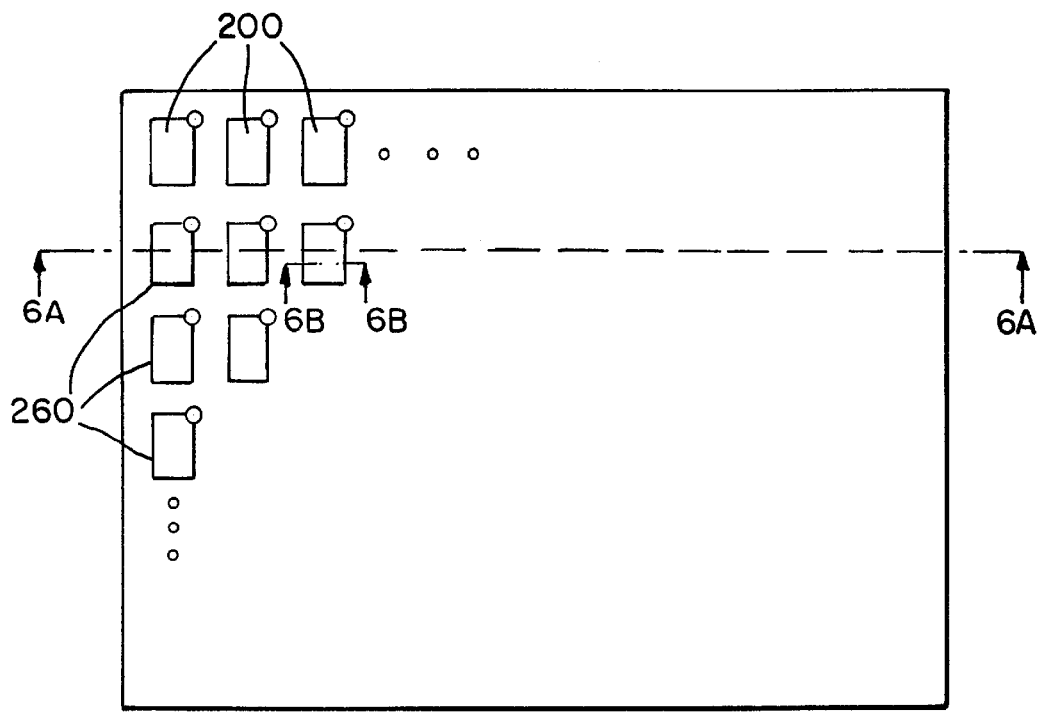

Referring to FIGS. 6–6B, each package portion 200 in the array of FIGS. 5–5B is surrounded by insulating layer 260. As seen in FIG. 5B, the insulation covers the portions of each package in the same manner as that shown in FIGS. 3 and 4 and discussed above. Thus, the land, connecting wire and gate pad for each package portion 200 is covered by the insulating layer 260. FIG. 6B shows insulating layer 260 extending from the edge of metal region 214 on the top of die 212 down to the top surface of wafer segment 220. It also shows the layer 260 insulating gate fingers 252. Coverage of the gate pad is seen in FIG. 6, where the insulating layer 260 covers the small bulges 201.

Insulating layer 260 may be an oxide constructed by suitable masking and deposition.

Figure 6A:
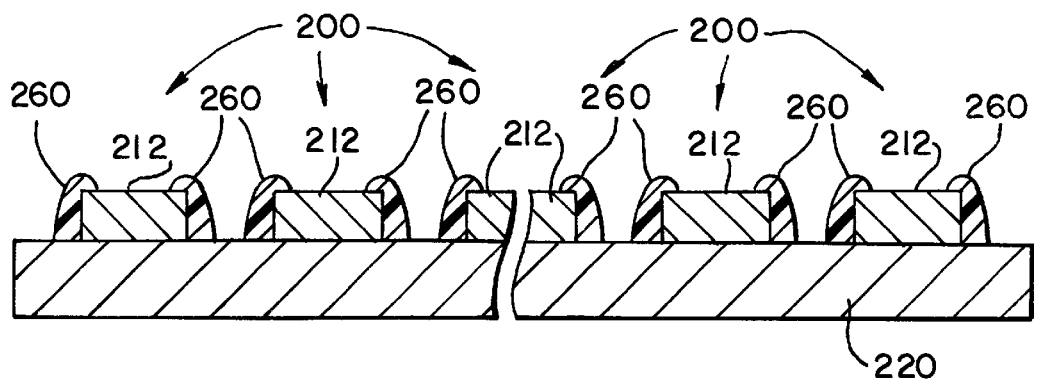
Figure 7:
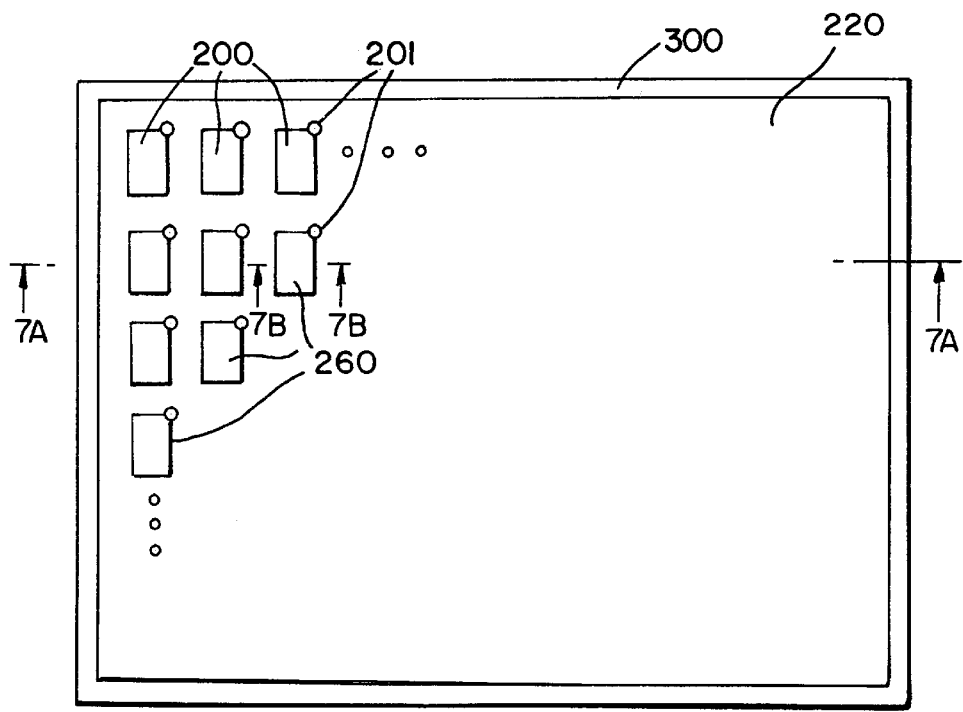
FIGS. 7 and 7A are the semiconductor wafer and semiconductor die of FIGS. 6 and 6A, respectively, having a dam surrounding the perimeter of the semiconductor wafer in accordance with the invention (thus, FIG. 7A is taken across lines 7A—7A of FIG. 7)
Figure 7A:
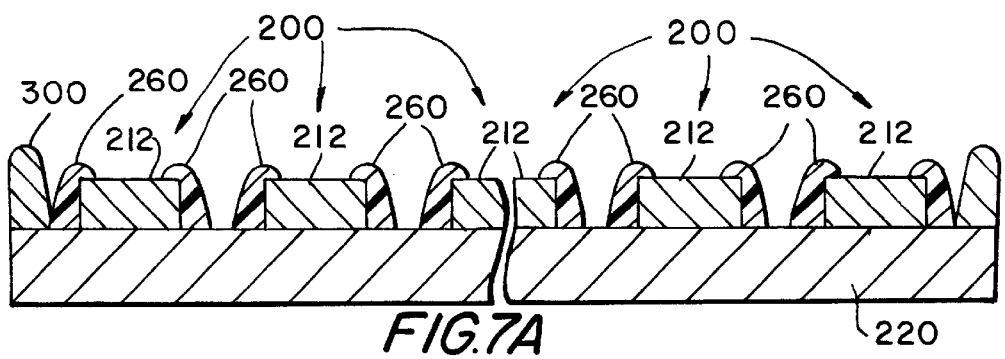

Referring to FIGS. 7 and 7A, the entire perimeter of wafer 220 shown in FIGS. 6 and 6A is surrounded by dam 300. FIG. 7A shows that the height of dam 300 is greater than the height of insulating layers 260 and each die 212. Dam 300 can be, for example, an oxide layer. Alternatively, as shown in FIG. 6B, dam 300' may be a bracket that fits securely around the perimeter of the wafer 220 using, for example, a seal 302.

Figure 7B:
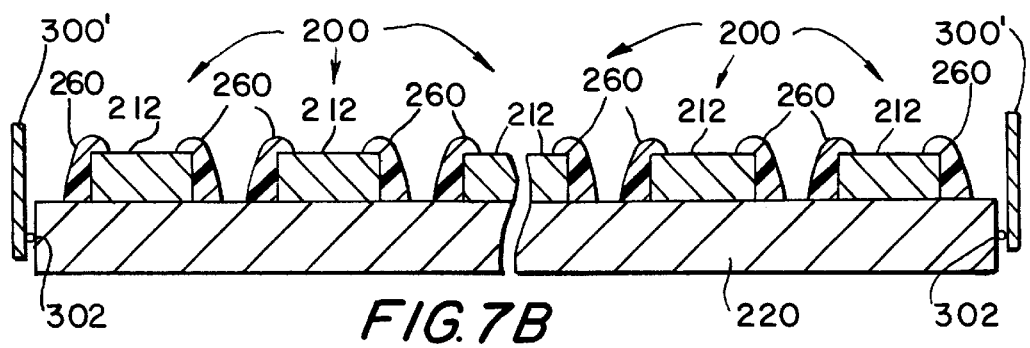
FIG. 7B is an alternative embodiment of the dam of the present invention shown in FIG. 7A.

The dam shown in FIGS. 7, 7A and 7B may be created before or after creation of the insulating layer 260 described above. If the dam 300 of FIGS. 7 and 7A is the same material as the insulating layer 260, it may be applied at the same time, for example, by suitable masking and deposition Next, a flowable metal is poured on top of the wafer 220 into the area defined by dam 300. The metal layer is poured to a height above the surfaces of die 220 and insulating layers 260. Metal layer 270 is an initially flowable metal that hardens or is curable into a solid, as described above.

Figure 8:
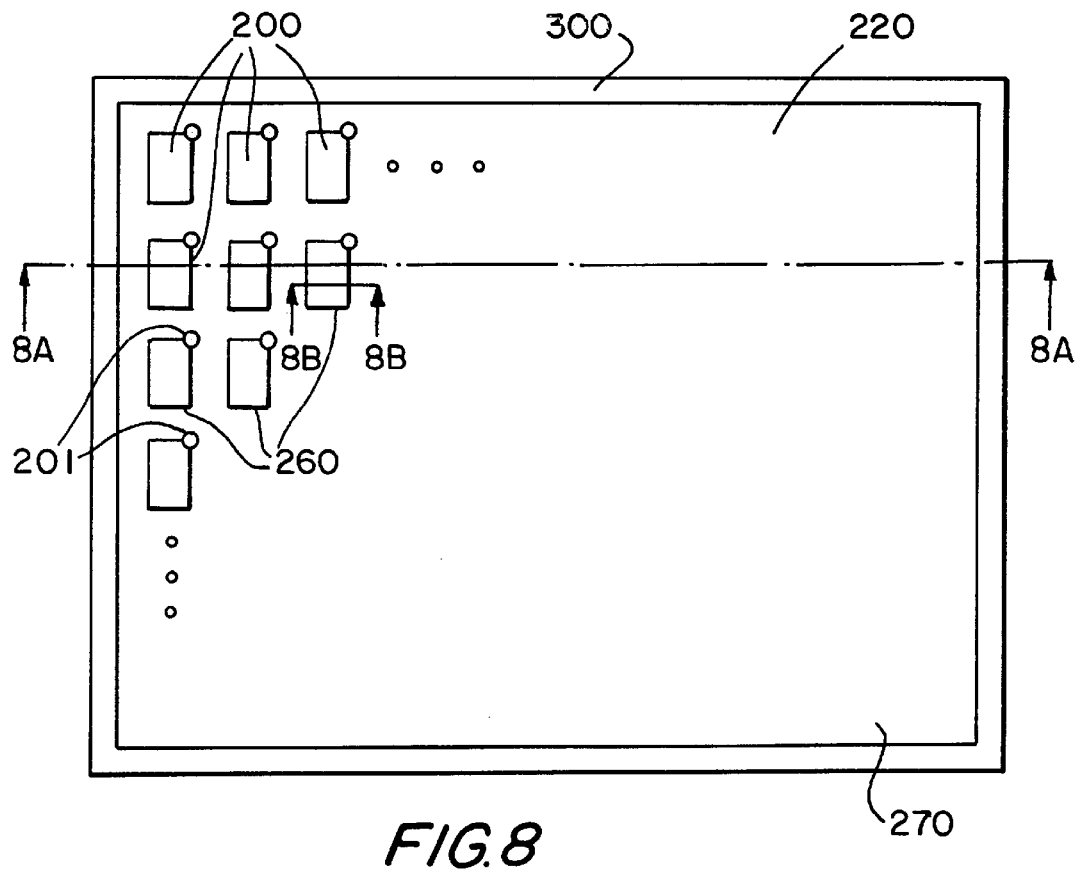
FIGS. 8–8A are the semiconductor wafer and semiconductor die of FIGS. 6–6B, respectively, having a lead free replacement metal layer deposited in the region defined by the dam in FIGS. 7–7B in accordance with the invention (thus, FIG. 8A is taken across lines 8A—8A of FIG. 8 and FIG. 8B is taken across lines 8B—8B of FIG. 8)
Figure 8A:
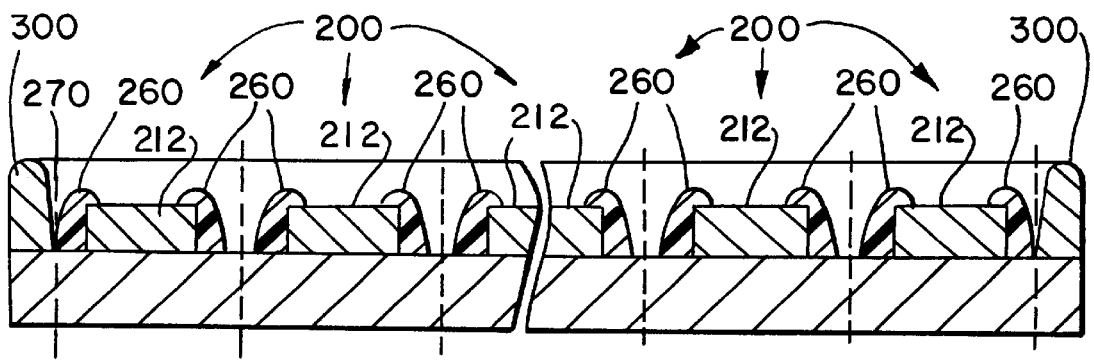
Figure 8B:
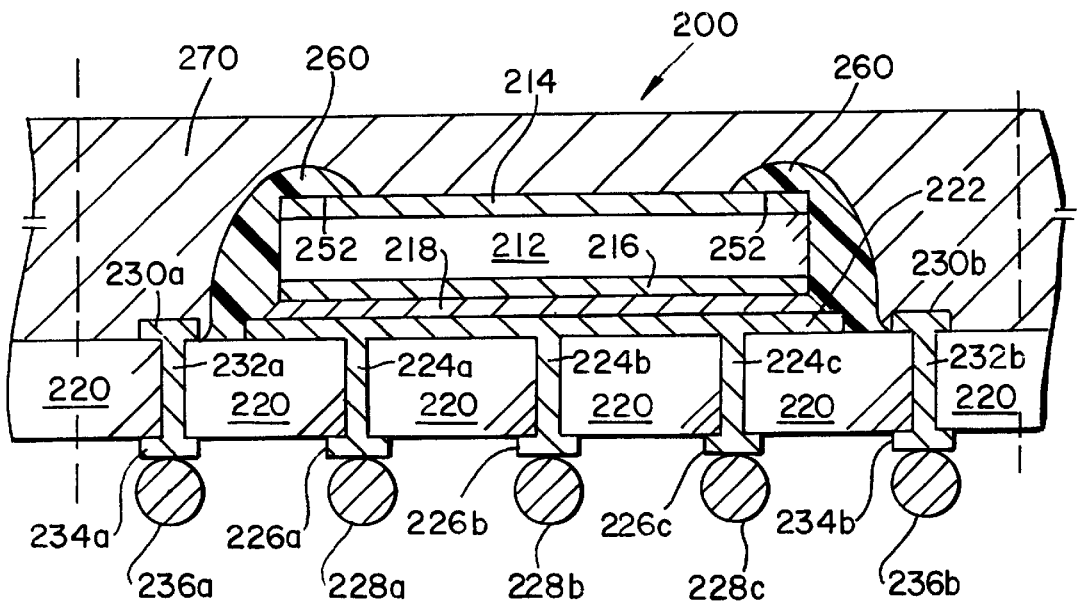

FIGS. 8–8B show the resulting metal layer 270 for the array of die 200. As best seen in FIGS. 8 and 8A, metal layer 270 lies above wafer 220 within dam 300. (Thus, metal layer 270 has only been shown in part in FIG. 8, since it would cover the top view of the device entirely.) FIG. 8B shows a cross-section of an individual die 200 (such as that shown in FIGS. 5B and 6B) and shows that the metal layer 270 is higher than insulating layer 260, thus forming an electrical pathway from the metal region 214 to upper lands 230a, 230b.

The material for metal layer 270 should be of an initially high viscosity, which subsequently hardens, or can be hardened or cured into a solid. The metal should have a low melting temperature (thus remaining liquified at a relatively low temperature) so that it can be poured over the wafer without ruining the junction patterns in the die. Ablebond 8175A or Ablebond 8260, available from Emerson & Cumings (a division of I.C.I. Corporation), for example, is suitable for the flowable, curable metal used for metal layer 270.

Figure 9:
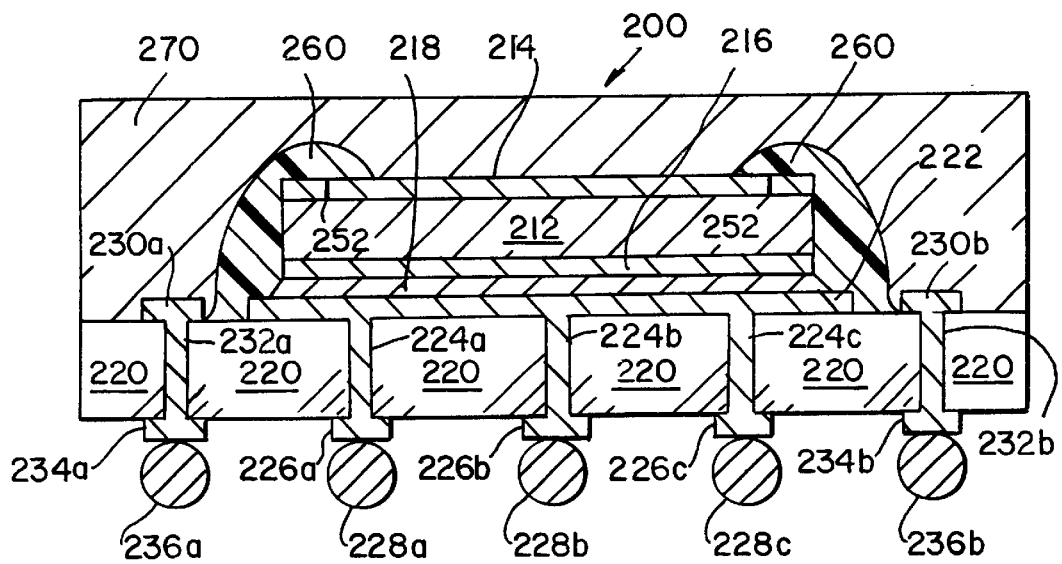
FIG. 9 is a resulting semiconductor package of the semiconductor wafer and die shown in FIG. 8–8B after cleaving in accordance with the invention.

The semiconductor wafer 220 is then cleaved or sawn between package portions 200, as shown by the broken lines in FIGS. 8–8B. This results in individual semiconductor packages 200, one of which is shown in FIG. 9. (FIG. 9 is the structure of FIG. 8B after cleaving along the broken lines shown in FIG. 8B.) FIG. 9, of course, is identical to the individual embodiments shown in FIGS. 3–5, with each corresponding reference number increased by 100.

Again, as noted above, manufacture of the individual die from a wafer supporting many die, as described above with respect to FIGS. 5–9 is not limited to any particular type of semiconductor device. It includes any semiconductor package that has an upper metalized region connected to upper die connections, such as MOSFETs, transistors, diodes, etc. The insulating layer 260 would cover exposed areas of the die that are electrically connected to the semiconductor elements other than the upper die connections. After pouring and curing, the metal layer 270 would provide an expansive connection between the upper metalized region and external electrical connections, such as lands 230a, 230b.

Figure 10:
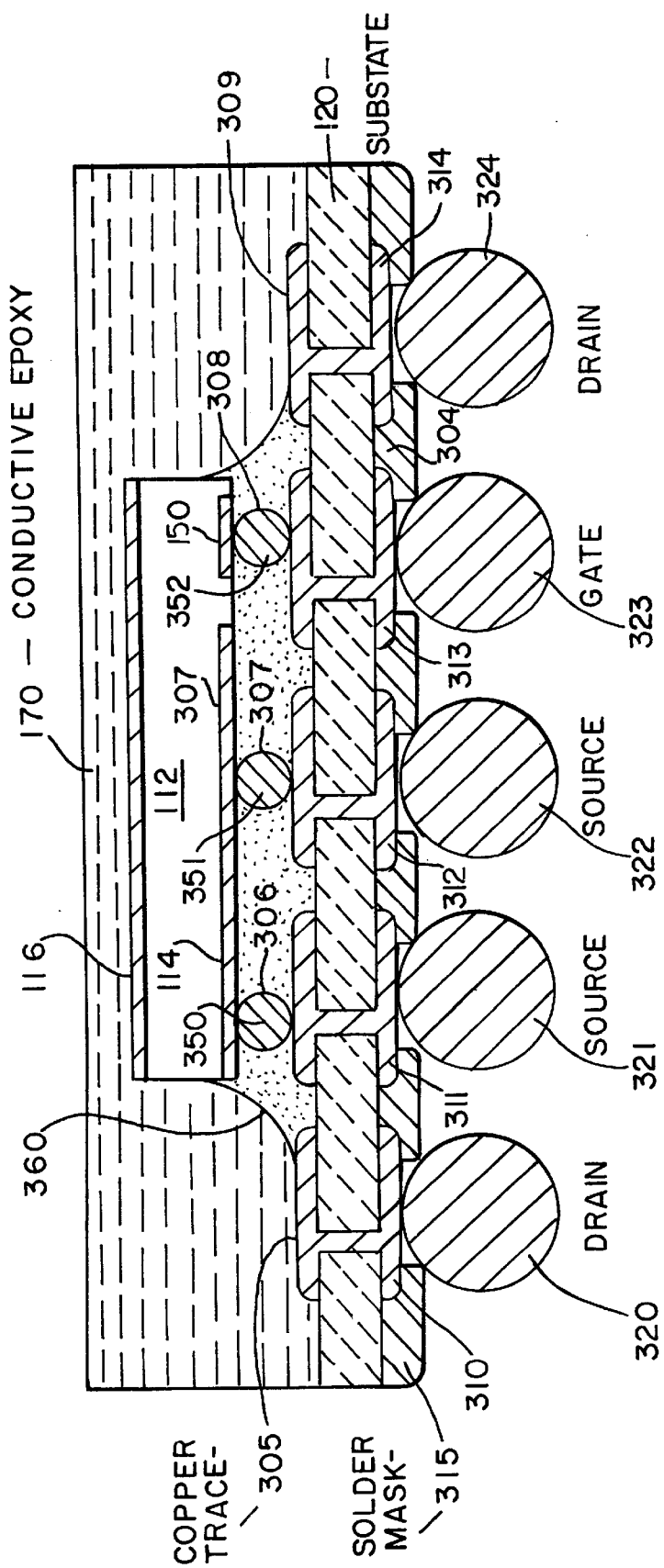
FIG. 10 is a cross-section of the device of the invention in a flip-chip embodiment.

The novel invention can be used for a wide variety of packages. Thus, FIG. 10 shows the use of the invention for a flip-chip type structure. In FIG. 10, parts similar to those of the preceding Figures are given the same identifying numerals. Thus, an insulation substrate 120 has a plurality of vias 300, 301, 302, 303 and 304 which have top copper traces 305, 306, 307, 308 and 309 respectively. A solder mask 315 insulates traces 310 to 314 from one another, and solder balls 320, 321, 322, 323 and 324 are connected to traces 310 to 314 respectively.

The die 112 in FIG. 10 is inverted so that source electrode 114 and gate electrode 150 face downward. A plurality of conductive bumps such as solder balls or stubs 350 and 351 are formed on copper traces 306 and 307, to contact source electrode 114 and a similar bump 352 is secured to plating 308 and contacts gate electrode 150. The die 112 is secured to the substrate 120 by a non conductive underfill epoxy 360 which insulates the drain electrode 116 and source electrodes 114 and gate electrode 150 from one another and holds these electrodes in contact with the substrate plating.

A flowable metal 170 (including a conductive epoxy) then covers the die 112 and epoxy 360 and connects the drain 116 to copper traces 305 and 309. Therefore, solder balls 320 and 324 are drain connections, solder balls 321 and 322 are source connections and solder ball 323 is gate connection. Obviously, the drain and source solder balls may be ones of lines of balls which extend along the width of the package (into the paper).

Although the present invention has been described in relation to particular embodiments thereof, many other variations and modifications and other uses will become apparent to those skilled in the art. Thus, the present invention is not limited by the specific disclosure herein.

What is claimed is:
1. A semiconductor device comprising:
   a) a substrate having at least one electrical connection region on a surface thereof,
   b) a die having a bottom surface portion supported by the surface of the substrate and a top surface portion comprising a metal layer and a number of semiconductor elements below the metal layer, the top surface portion and the bottom surface portion separated by a die body portion lying above the surface of the substrate, and
   c) a conforming metal layer for carrying electric power to the die, said conforming metal layer covering at least a portion of the area of the metal layer of the top surface of the die and electrically interfacing with the at least one electrical connection region.

2. A semiconductor device as in claim 1, wherein the conforming metal layer is comprised of a flowable, curable conductor.

3. A semiconductor device as in claim 1, wherein the conforming metal layer is an initially high viscosity conductive material that hardens or is curable into a solid.

4. A semiconductor device comprising:
   a) a substrate having an upper surface with a central region and a surrounding perimeter region, the surrounding perimeter region having at least one electrical land residing thereon,
   b) a die having a bottom surface portion supported by at least a portion of the central region of the substrate and a top surface portion comprising a metal layer and a number of semiconductor elements below the metal layer, the top surface portion and the bottom surface portion separated by a die body portion lying above the surface of the substrate, and
   c) a conforming metal layer for carrying electric power to the die, said conforming metal layer covering at least a portion of the area of the metal layer of the top surface of the die and electrically interfacing with the at least one electrical land on the perimeter region of the substrate.

* * * * *